United States Patent
Lee et al.

(10) Patent No.: US 8,593,898 B2
(45) Date of Patent: Nov. 26, 2013

(54) ELECTRONIC DEVICE AND MEMORY DEVICE OF CURRENT COMPENSATION

(75) Inventors: Seung-Won Lee, Gyeonggi-do (KR); Sung-Hee Cho, Gyeonggi-do (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 91 days.

(21) Appl. No.: 13/291,492

(22) Filed: Nov. 8, 2011

(65) Prior Publication Data

US 2012/0113737 A1 May 10, 2012

(30) Foreign Application Priority Data

Nov. 8, 2010 (KR) .................... 10-2010-0110172

(51) Int. Cl.
*G11C 7/00* (2006.01)

(52) U.S. Cl.
USPC .................. 365/226; 365/210.11; 365/185.21

(58) Field of Classification Search
USPC .................. 365/226, 210.11, 185.21, 189.11; 323/220, 315, 312
See application file for complete search history.

(56) References Cited

U.S. PATENT DOCUMENTS

| 7,969,124 B2* | 6/2011 | Matsuda ........................ 323/220 |
| 7,978,558 B2* | 7/2011 | Kunst ............................ 365/226 |
| 8,050,084 B2* | 11/2011 | Bae et al. ....................... 365/163 |

FOREIGN PATENT DOCUMENTS

| JP | 2004-234596 | 8/2004 |
| JP | 2008-305148 | 12/2008 |
| KR | 10-2009-0128101 | 12/2009 |

* cited by examiner

*Primary Examiner* — David Lam
(74) *Attorney, Agent, or Firm* — Stanzione & Kim, LLP

(57) ABSTRACT

An electronic device includes a functional unit and a current compensation unit. The functional unit operates based on a power supplied by an external host through power supply lines and generates a control signal based on an amount of power consumption of the functional unit. The current compensation unit compensates a change in a power supply current based on the control signal, where the power supply current is a current flowing through the power supply lines.

20 Claims, 10 Drawing Sheets

108

300a

ELECTRONIC DEVICE AND MEMORY DEVICE OF CURRENT COMPENSATION

CROSS-REFERENCE TO RELATED APPLICATIONS

This application claims the benefit of Korean Patent Application No. 10-2010-0110172 filed with the Korea Industrial Property Office on Nov. 8, 2010, the disclosure of which is incorporated herein by reference.

BACKGROUND

1. Field of the General Inventive Concept

The general inventive concept relates to noise reduction, and more particularly to an electronic device and a memory device to compensate a power supply current passing through power supply lines.

2. Description of the Related Art

In general, an electronic device having no independent power source have to be powered by an external power source through power supply lines. A power supply current flowing through the power supply lines may fluctuate according to a change in power consumption of the electronic device. The power supply lines for supplying power from an external host to the electronic device typically have considerable inductance. Thus, as the length of the power supply lines is increased, the fluctuation in power supply current may result in significant fluctuation in power supply current. The fluctuation in the power supply current may cause an electromagnetic interference (EMI) in the electronic device.

SUMMARY OF THE PRESENT GENERAL INVENTIVE CONCEPT

Some example embodiments provide an electronic device capable of compensating a change in a power supply current passing through power supply lines.

Some example embodiments provide a memory device capable of compensating a change in a power supply current passing through power supply lines.

According to some example embodiments, an electronic device includes a functional unit and a current compensation unit. The functional unit is configured to operate based on a power that is supplied by an external host through power supply lines, and configured to generate a control signal based on an amount of power consumption of the functional unit. The current compensation unit configured to compensate a change in a power supply current based on the control signal, where the power supply current is a current flowing through the power supply lines.

The current compensation unit may include a current control unit configured to generate a control current based on the control signal received from the functional unit such that the control current is proportional to a driving current provided to the functional unit, and a variable current supply unit configured to generate a compensation current based on the control current such that the compensation current increases when the control current decreases and the compensation current decreases when the control current increases.

The variable current supply unit may include a first transistor configured to generate a first compensation current based on the control current such that the first compensation current increases when the control current decreases and the first compensation current decreases when the control current increases, and a second transistor coupled to the first transistor to form a current mirror structure having a mirror ratio, the second transistor being configured to generate a second compensation current that is proportional to the first compensation current.

A sum of the first compensation current and the control current corresponds to a reference current. The variable current supply unit may further include a current source commonly coupled to the first transistor and the current control unit to generate the reference current that is substantially constant.

The current control unit may include a transistor configured to receive the control signal through a control terminal and configured to generate the control current based on the control signal.

The functional unit may include a low-dropout regulator connected between the power supply lines, the low-dropout regulator being configured to generate a driving voltage based on a power supply voltage, and an I/O driver configured to operate based on the driving voltage and configured to transmit data to the external host through at least one data line.

The low-dropout regulator may include a transistor configured to receive the control signal through a control terminal and configured to generate a driving current that is adjusted based on the control signal, and a comparator configured to compare a target voltage and a reference voltage to generate the control signal, the target voltage being proportional to the current of the transistor.

The functional unit may include a pass transistor configured to generate a driving current based on the control signal, and the current compensation unit includes a control transistor configured to generate a control current based on the control signal, where the control current is proportional to the driving current.

The current compensation unit may further include at least one current mirror configured to generate a compensation current such that the compensation current increases when the control current decreases and the compensation current decreases when the control current increases.

The functional unit may be configured to drive at least one data line to perform data communication in accordance with universal serial bus (USB) protocol, and the current compensation unit may be configured to generate a compensation current while the functional unit drives the at least one data line, so that the power supply current flowing through the power supply lines remains substantially constant.

The electronic device may further include a switch unit configured to electrically disconnect the current compensation unit from the power supply lines in response to an enable signal indicating operation modes of the functional unit.

According to some example embodiments, a memory device includes a memory unit configured to store data, a function unit and a current compensation unit. The functional unit is configured to transmit the data through at least one data line based on a power supplied by an external host through the power supply lines, and configured to generate a control signal based on an amount of power consumption of the functional unit. The current compensation unit is configured to compensate a change in a power supply current based on the control signal while the functional unit transmits the data to the external host, the power supply current flowing through the power supply lines.

The memory device may perform data communication with the external host in accordance with universal serial bus (USB) protocol.

The memory device may further include a mode detection unit configured to detect operation modes of the memory device to generate an enable signal, and a switch unit configured to electrically disconnect the current compensation unit from the power supply lines in response to the enable signal.

In another feature according to the present general inventive concept, a method of stabilizing a power supply current delivered from a power supply to a functional unit includes determining an initial current value of a driving current delivered to the functional unit, detecting a change of an operation mode of the functional unit, and detecting a change of the initial current value of the driving current in response to the change of the operation mode, generating a control signal indicating the change of the current value of the driving current, and generating a compensation control current based on the control signal that compensates the change of current value of the driving current to stabilize the power supply current delivered from the power supply.

Additional features and utilities of the present general inventive concept will be set forth in part in the description which follows and, in part, will be obvious from the description, or may be learned by practice of the general inventive concept.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

DETAILED DESCRIPTION OF THE EXEMPLARY EMBODIMENTS

Figure 1:
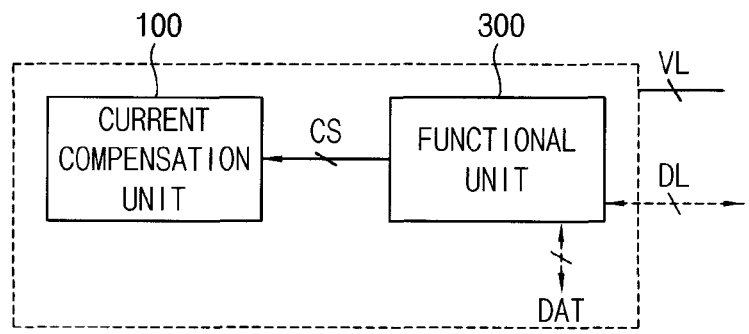
FIG. 1 is a diagram illustrating an electronic device according to some example embodiments.

Reference will now be made in detail to exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

It can be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It can be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein describes exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating an electronic device according to some example embodiments.

Referring to FIG. 1, an electronic device 10 includes a functional unit 300 and a current compensation unit 100.

The functional unit 300 operates based on a power that is supplied by an external host (not shown) through power supply lines VL. The functional unit 300 may perform predetermined operations, such as data transmission, signal processing, data storing and data reading, etc., that lead to a time-varying current in the power supply lines VL. The functional unit 300 may include, but is not limited to, a dynamic random-access memory (DRAM) memory module (including a doublet data rate (DDR) memory module and a synchronous dynamic random-access memory (SDRAM) memory module), NAND flash memory module and NOR flash memory module, a resistive random-access memory (RRAM) memory module, a phase-change (PRAM) memory module, and a magnetoresistive random-access memory (MRAM) memory module. In at least one exemplary embodiment, data transmission may indicate transmitting and/or receiving data from and/or to the host externally located from the electronic device 10. The power consumption of the functional unit 300 may result from at least one of internal impedance, magnetic reluctance and emission of electromagnetic wave. Hereinafter, the time-varying current flowing through the power supply lines VL will be referred to as a power supply current.

The functional unit 300 may be provided with power supply voltages and the power supply current from the host and/or an external power supply device through the power supply lines VL. The power consumption of the electronic device 10 may be varied according to operation modes of the electronic device 10. The functional unit 300 generates a control signal CS based on an amount of power consumption of the functional unit 300. The functional unit 300 provides the control signal CS to the current compensation unit 100. The control signal CS may be a voltage signal to control transistors included in the current compensation unit 100.

The current compensation unit 100 compensates a change in the power supply current based on the control signal CS, where the power supply current flows through the power supply lines VL. For example, the current compensation unit 100 may generate a compensation current that relates to the change in the power supply current. The current compensation unit 100 may control an amount of the power supply current based on the compensation current, and thus may reduce changes (or fluctuations) of the power supply current. The control signal CS may be a voltage signal of which magnitude is controlled based on an amount of a driving current of the functional unit 300 or an amount of the changes of the power supply current.

For example, when the driving current of the functional unit 300 increases, which may possibly result in an increase in the power supply current, the current compensation unit 100 may reduce the compensation current based on the control signal CS that represents the amount of the driving current. On the contrary, when the driving current decreases, which may possibly result in a decrease in the amount of the power supply current, the current compensation unit 100 may increase the compensation current based on the control signal CS.

Accordingly, the electronic device 10 according to some example embodiments may increase and/or decrease the compensation current that is a portion of the power supply current. Thus the electronic device 10 may maintain the power supply current substantially constant or may experience a change in the power supply current within a relatively small range, regardless of the operation modes of the functional unit 300. The small change in power supply current is negligible such that the electronic device experiences virtually no change in the power supply current. Thus, the electronic device 10 may reduce noises due to fluctuations in the power supply lines VL.

Figure 2A:
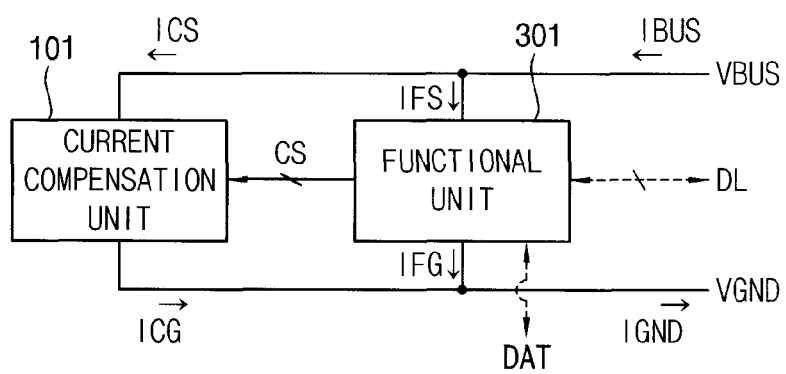
FIGS. 2A and 2B are block diagrams illustrating examples of the electronic device of FIG. 1.
Figure 2B:
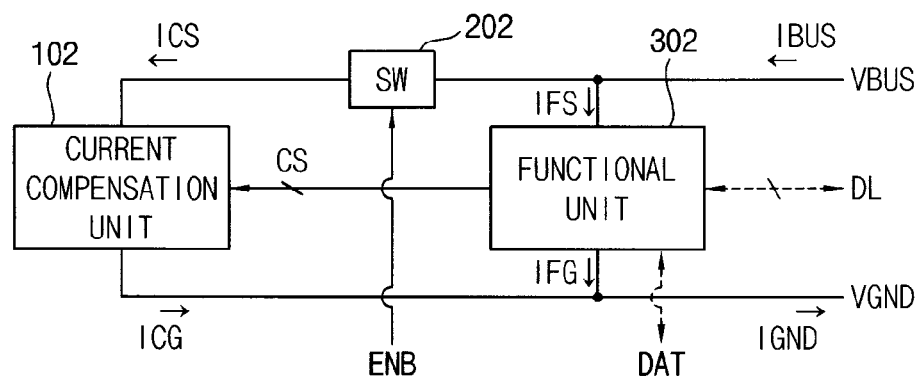

FIGS. 2A and 2B are block diagrams illustrating examples of the electronic device of FIG. 1.

Referring to FIG. 2A, an electronic device 11 includes a functional unit 301 and a current compensation unit 101.

The power supply lines VL may include a first power supply line VBUS and a second power supply line VGND. For example, the first power supply line VBUS may be applied with a positive voltage of the power supply voltages and the second power supply line VGND may be applied with a ground voltage. As illustrated in FIG. 2A, the current compensation unit 101 and the functional unit 301 may be coupled in parallel between the first power supply line VBUS and the second power supply line VGND.

The power supply voltages may have different magnitudes in accordance with interface protocols between the electronic device 11 and the host. For example, when the electronic device 11 interface with the host in accordance with a universal serial bus (USB) protocol, the host may apply a positive voltage of about 5V to the first power supply line VBUS and may apply a ground voltage of about 0V to the second power supply line VGND.

The power supply current may represent a first power supply current IBUS passing through the first power supply line VBUS or a second power supply current IGND passing through the second power supply line VGND. The first power supply current may include a first compensation control current ICS and a first driving current IFS. The first compensation control current ICS flows into the current compensation unit 101 and the first driving current IFS flows into the functional unit 301. The second power supply current may include a second compensation control current ICG and a second driving current IFG. The second compensation control current ICG flows out of the current compensation unit 101 and the second driving current IFG flows out of the functional unit 301. Assuming that there is no leakage current, an amount of the first compensation control current ICS may be substantially the same as an amount of the second compensation control current ICG. Similarly, an amount of the first driving current IFS may be substantially the same as an amount of the second driving current IFG. As described above, the amounts of the first and second driving currents IFS and IFG may be time-varying according to the operation modes of the functional unit 301. As shown in FIG. 2A, the amount of the first power supply current IBUS may be substantially equal to a sum of the amounts of the first compensation control current ICS and the first driving current IFS. Similarly, the amount of the second power supply current IGND may be substantially equal to a sum of the amounts of the second compensation control current ICG and the second driving current IFG.

The current compensation unit 101 may generate a compensation current based on change of the driving current IFS or IFG so that the power supply current IBUS may be maintained substantially constant regardless of the operation modes of the functional unit 300. The current compensation unit 101 may adjust the amount of the power supply current IBUS or IGND so that the change of the power supply current IBUS or IGND may be compensated. The control signal CS may be a voltage signal and voltage level of the control signal CS may be controlled based on the amount of the driving current IFS or IFG. The current compensation unit 101 may control the amounts of the first and second power supply currents IBUS and IGND. While the electronic device 11 performs operations, the current compensation unit 101 may control the amount of the compensation control current ICS or ICG based on the control signal CS so that the power supply current IBUS or IGND may be maintained substantially constant.

Figure 9:
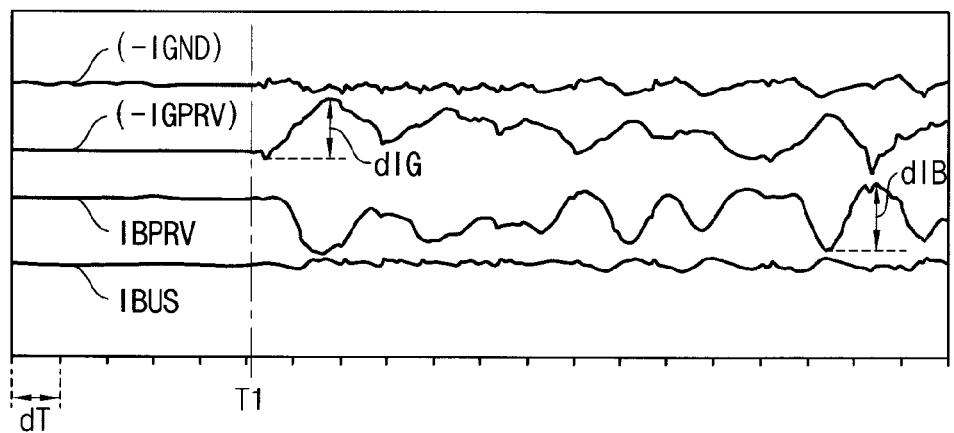
FIG. 9 illustrates waveforms of currents flowing through power supply lines connected to the electronic device of FIG. 1.

As described above, the first driving current IFS and the second driving current IFG may have substantially the same amounts to each other, and the first compensation control current ICS and the second compensation control current ICG may have substantially the same amounts to each other. Thus, the first power supply current IBUS and the second power supply current IGND may have substantially the same amounts to each other. Power supplying circuits in the host which drive the power supply lines VBUS and VGND may have different configurations, and thus the power supply currents IBUS and IGND may have different noises and characteristics to each other. The power supply currents IBUS and IGND may not have the exactly the same amounts to each other, but the amounts of the power supply currents may be changed in the same tendency as illustrated in FIG. 9.

Referring again to FIG. 2A, the current compensation unit 101 may control the compensation control current ICS or ICG of which span is substantially the same as span of the driving current IFS or IFG, which fluctuates according to operation modes of the electronic device 11. For convenience of description, the compensation control current ICS or ICG may have a positive amount and thus to flow into the electronic device 11 through the first power supply line VBUS and to flow out of the electronic device 11 through the second power supply line VGND. The current compensation unit 101 may include at least one current mirror that receives the control signal CS and controls the amount of the compensation control current ICS or ICG based on the received control signal CS.

The functional unit 300 may generate at least one driving voltage based on the power supply voltage where the driving voltage is used to drive internal components and/or circuits of the functional unit 300.

Accordingly, the electronic device 11 according to some example embodiments may increase and/or decrease the amount of the compensation control current ICS (or ICG) that is a portion of the power supply current IBUS (or IGND). Thus the electronic device 11 may maintain the power supply current substantially constant, or within a relatively small range. Thus, the electronic device 11 may reduce noises due to fluctuations in the power supply lines VBUS and VGND.

Referring to FIG. 2B, an electronic device 12 includes a functional unit 302, a current compensation unit 102 and a switch unit 202.

The switch unit 202 may be connected between the first power supply line VBUS and the current compensation unit 102. Although, for convenience of illustration, the switch unit 202 is illustrated to be connected between the first power supply line VBUS and the current compensation unit 102, the switch unit 202 may be connected between the second supply line VGND and the current compensation unit 102 in other example embodiments. That is, the switch unit 202 may be located on the first power supply line VBUS or on the second power supply line VGND. The switch unit 202 may electrically disconnect the current compensation unit 102 from one of the power supply lines VBUS and VGND in response to an enable signal ENB indicating operation modes of the functional unit 302. The enable signal ENB may be output from the functional unit 302, or may be output from a mode detection unit, which is discussed further below, that detects the operating mode of the function unit 302. In another example embodiment, the electronic device 12 of FIG. 2B may further include another switch unit connected between the second power supply line VGND and the current compensation unit 102.

The electronic device 12 may have various operation modes. For example, the electronic device may operate in a data transfer mode while data are transferred between the electronic device 12 and the external host, and may operate in an internal operation mode without data transfer to or from the host. For example, during the data transfer mode, the switch unit 202 may be closed in response to the activated enable signal ENB to allow the flow of the compensation control current ICS or ICG. In contrast, during the internal operation mode, the switch unit 202 may be opened in response to the deactivated enable signal ENB to block the flow of the compensation control current ICS or ICG. As such, the power noise in the power supply lines during data transfer may be prevented from influencing the adjacent data line.

The switch unit 202 may include a transistor that controls electrical connection between an input terminal (i.e., source) and an output terminal (i.e., drain) in response to the enable signal ENB applied to a control terminal (i.e., gate). The electrical device 12 may generate internally the enable signal ENB in an example embodiment, or the enable signal ENB may be provided by an external device (e.g., the host) in another example embodiment.

The electronic device 12 of FIG. 2B is similar to the electronic device 11 of FIG. 2A except that the electronic device 12 further includes the switch unit 202 and thus repeated descriptions are omitted.

Figure 3A:
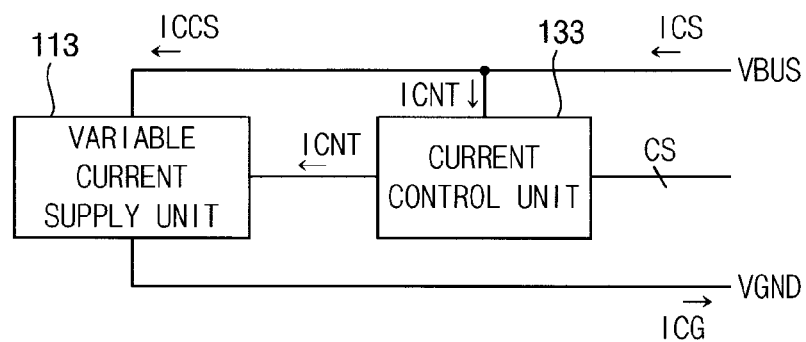
FIGS. 3A and 3B are block diagrams illustrating examples of the current compensation unit in the electronic device of FIG. 1.
Figure 3B:
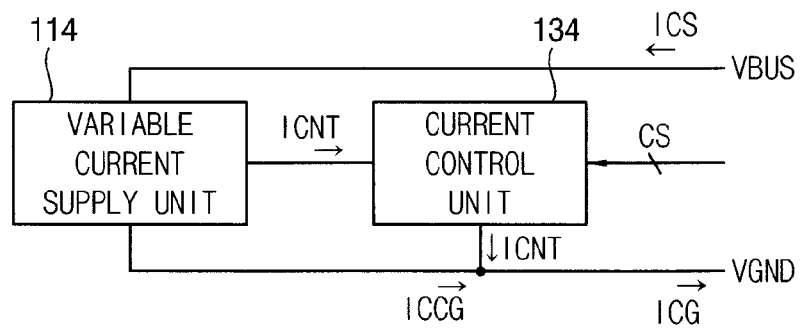

FIGS. 3A and 3B are block diagrams illustrating examples of the current compensation unit in the electronic device of FIG. 1.

FIG. 3A illustrates an example of the current compensation unit where a control current ICNT flows from the first power supply line VBUS to a variable current supply unit 113. FIG. 3B illustrates another example of the current compensation unit where the control current ICNT flows from a variable current supply unit 114 to the second power supply line VGND.

Referring to FIG. 3A, a current compensation unit 103 may include a current control unit 133 and a variable current supply unit 113. The current control unit 133 may generate a control current ICNT based on the control signal CS received from the functional unit 300, such that the control current ICNT is proportional to a driving current IFS provided to the functional unit 300. The variable current supply unit 113 may generate a compensation current ICCS based on the control current ICNT, such that the compensation current ICCS increases when the control current ICNT decreases and the compensation current ICCS decreases when the control current ICNT increases. An amount of the compensation current ICCS may be adjusted based on an amount of the control current ICNT.

The current control unit 133 may control an amount of the control current ICNT based on the control signal CS. For example, the value of the control current ICNT may be adjusted based on the value of the control signal CS. The control current ICNT may flow in a direction from the first power supply line VBUS to the variable current supply unit 113. Thus, when the control current ICNT increases, the first power supply current IBUS including the first compensation control current ICS may be increased by the amount of the control current ICNT. The variable current supply unit 113 may generate a compensation current ICCS based on the control current ICNT. As illustrated in FIG. 3A, the variable current supply unit 113 may receive the compensation current ICCS and the control current ICNT and output the second compensation control current ICG. For convenience of description, the currents ICCS, ICNT and ICG may have positive value. Moreover, the currents ICCS and ICNT may have directions towards the variable current supply unit 113. Thus, the compensation current ICCS indicates a current flowing from the first power supply line VBUS to the variable current supply unit 113. The control current ICNT indicates a current flowing from the current control unit 133 to the variable current supply unit 113. The second compensation control current ICG indicates a current flowing from the variable current supply unit 113 to the second power supply line VGND.

As will be described with reference to FIGS. 4A and 5A, the current compensation unit may include at least one pair of transistors P21, P22, having a current mirror structure. The current mirror structure may generate a mirrored current flowing through the one transistor of the pair of the transistors where the mirrored current flowing through the one transistor is proportional to a base current flowing through the other transistor of the pair of the transistors. The compensation current ICCS includes the mirrored current and the base current. The first compensation control current ICS includes the compensation current ICCS and the control current ICNT. Thus, the amount of the mirrored current may relate to the amount of the compensation current ICCS. The amount of the base current may be determined based on the control current ICNT and the amount of the control current ICNT may be determined based on control signal CS generated based on the driving current IFS. As such, the amount of the mirrored current may relate to the amount of the driving current IFS of the functional unit 300 in FIG. 1, and thus the variable current supply unit 113 may control the amount of the compensation current ICCS based on the control current ICNT. In an example embodiment, the current mirror structure may include a pair of P-type transistors.

The current control unit 133 may detect the amount of the driving current IFS based on the control signal CS and may generate the control current ICNT that is used to control the amount of the compensation current ICCS by the variable current supply unit 113. As a result of the above operation of the variable current supply unit 113, the current control unit 133 may control the compensation current ICCS by varying the amount of the control current ICNT. Accordingly, the current control unit 133 may detect an amount of a current flowing through a component such as a pass transistor in the functional unit 300 of FIG. 1. The current control unit 133 may include a P-type transistor that construct a current mirror structure together with another P-type transistor in the functional unit 300.

In at least one exemplary embodiment illustrated in FIG. 3B, a current compensation unit 104 may include a current control unit 134 and a variable current supply unit 114. The current control unit 134 may generate the control current ICNT based on the control signal CS received from the functional unit 300, such that the control current ICNT is proportional to a driving current IFS provided to the functional unit 300. The variable current supply unit 114 may generate a compensation current ICCG based on the control current ICNT, such that the compensation current ICCG increases when the control current ICNT decreases and the compensation current ICCG decreases when the control current ICNT increases. An amount of the compensation current ICCG may be adjusted based on an amount of the control current ICNT.

The current control unit 134 may control an amount of the control current ICNT based on the control signal CS. The control current ICNT may flow in a direction from the variable current supply unit 114 to the second power supply line VGND. Thus, when the control current ICNT increases, the second power supply current IGND including the second compensation control current ICG may be increased by the amount of the control current ICNT. The variable current supply unit 114 may generate a compensation current ICCG based on the control current ICNT. As illustrated in FIG. 3B, the variable current supply unit 114 may output the compensation current ICCG and the control current ICNT and receive the first compensation control current ICS. For convenience of description, the currents ICCG, ICNT and ICS may have a positive value. Moreover, the currents ICCG and ICNT may have directions out of the variable current supply unit 114. Thus, the compensation current ICCG may indicate a current flowing from the variable current supply unit 114 to the second power supply line VGND. The control current ICNT may indicate a current flowing from the variable current supply unit 114 to the current control unit 134. The first compensation control current ICS may indicate a current flowing from the first power supply line VBUS to the variable current supply unit 114.

Figure 4A:
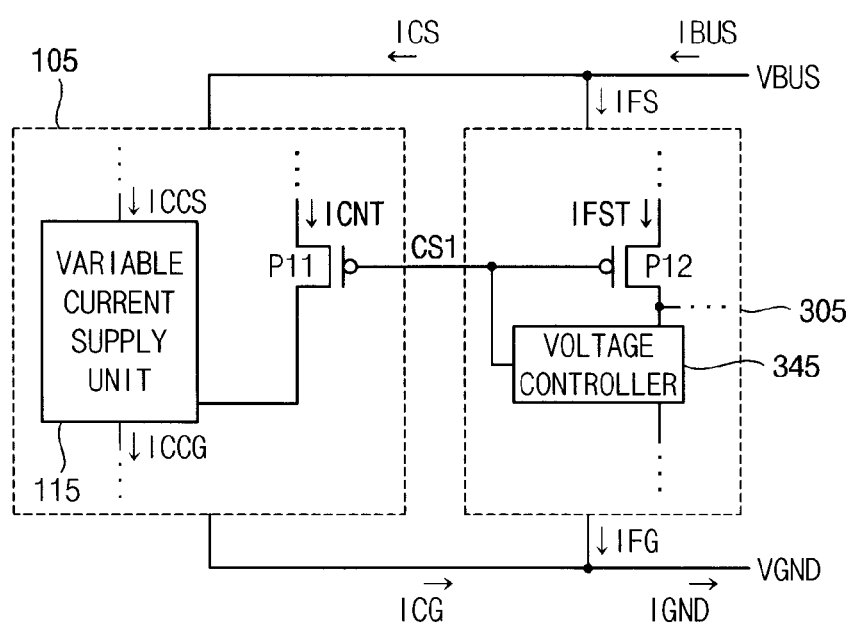
FIGS. 4A and 4B are diagrams illustrating other examples of the electronic device of FIG. 1
Figure 4B:
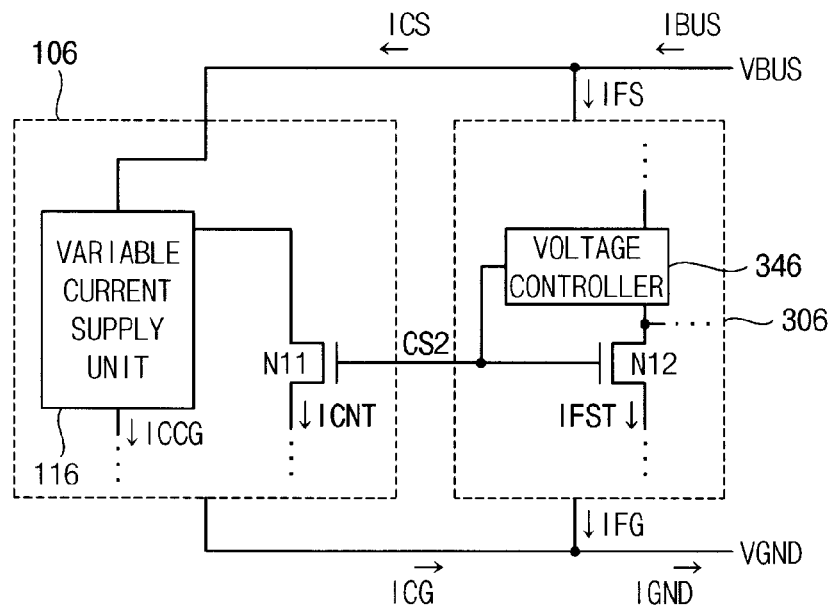
Figure 5A:
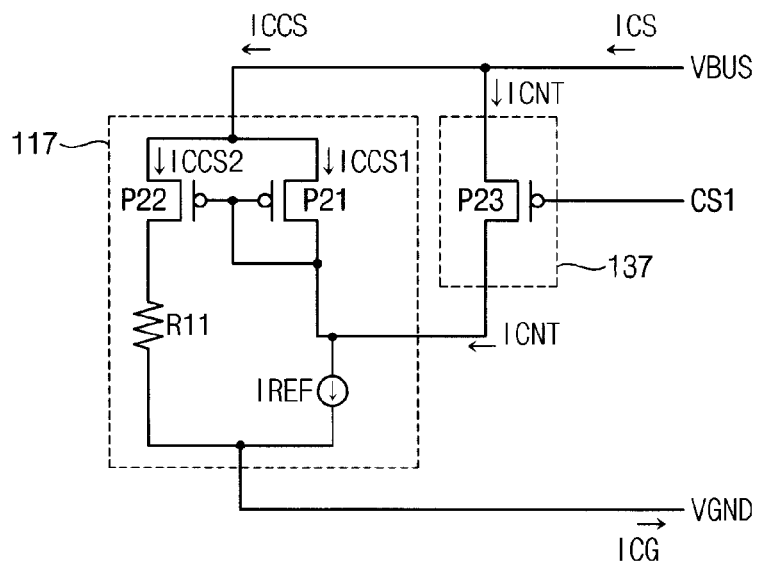
FIG. 5A is a circuit diagram illustrating an example of the current compensation unit in the electronic device of FIG. 4A.
Figure 5B:
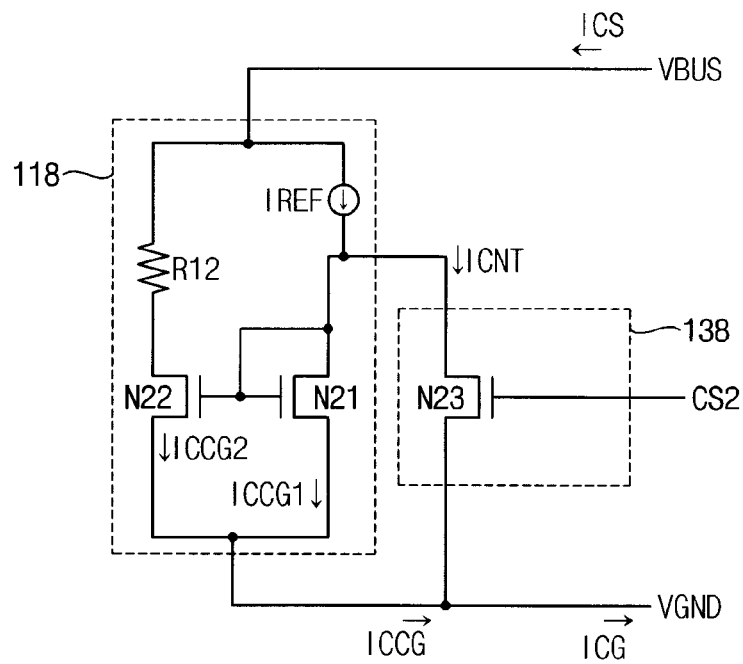
FIG. 5B is a circuit diagram illustrating an example of the current compensation unit in the electronic device of FIG. 4B.

In at least one exemplary embodiment illustrated in FIGS. 4B and 5B, the variable current supply unit 114 may include at least one pair of transistors, which has a current mirror structure. The mirror structure, for example, may include the each transistor having their respective base connected to each other. The current mirror structure may generate a mirrored current flowing through the one transistor of the pair of the transistors where the mirrored current flowing through the one transistor is proportional to a base current flowing through the other transistor of the pair of the transistors. The compensation current ICCG includes the mirrored current and the base current. The second compensation control current ICG includes the compensation current ICCG and the control current ICNT. Thus, the amount of the mirrored current may relate to the amount of the compensation current ICCS. The amount of the base current may be determined based on the control current ICNT and the amount of the control current ICNT may be determined based on control signal CS generated based on the driving current IFS. As such, the amount of the mirrored current may relate to the amount of the driving current IFS of the functional unit 300 in FIG. 1, and thus the variable current supply unit 114 may control the amount of the compensation current ICCG based on the control current ICNT. In an example embodiment, the current mirror structure may include a pair of N-type transistors.

The current control unit 134 may detect the amount of the driving current IFS based on the control signal CS, and may generate the control current ICNT that is used to control the amount of the compensation current ICCG by the variable current supply unit 114. As a result of the above operation of the variable current supply unit 114, the current control unit 134 may control the compensation current ICCG by varying the amount of the control current ICNT. Accordingly, the current control unit 134 may detect an amount of a current flowing through a component such as a pass transistor in the functional unit 300 of FIG. 1. The current control unit 134 may include an N-type transistor that constructs a current mirror structure together with another N-type transistor in the functional unit 300.

FIGS. 4A and 4B are diagrams illustrating other examples of the electronic device of FIG. 1

Referring to FIG. 4A, an electronic device 15 may include a functional unit 305 and a current compensation unit 105. The functional unit 305 may include a pass transistor P12. The pass transistor P12 may pass a current IFST flowing from the first power supply line VBUS. The functional unit 305 may control an amount of the current IFST based on the control signal CS1. For example, the value of the current IFST may be varied based on the value of the control signal CS1. The current compensation unit 105 may include a control transistor P11 connected to the pass transistor P12 to form a current mirror structure having a mirror ratio M. The control transistor P11 may pass the control current ICNT that is proportional to the current IFST of the pass transistor P12. The mirror ratio M corresponds to a ratio of the current IFST to the control current ICNT. For example, the control current ICNT may be M times smaller than the current IFST. Thus, the current compensation unit 105 may output the second compensation control current ICG in response to the current IFST of the pass transistor P12. Accordingly, the current compensation unit 105 may compensate the changes of the power supply current IBUS and/or IGND based on the control current ICNT. The transistors P11 and P12 may be P-type transistors. Additionally, the functional unit 305 may include a voltage regulator using a P-type transistor as the pass transistor P12.

The current compensation unit 105 may detect changes of the driving current IFS and/or IFG because the control transistor P11 pass the control current ICNT of which the amount is proportional to the current IFST flowing thorough the pass transistor P12, where the pass transistor P12 and the control transistor P11 form the current mirror structure having the current mirror ratio M. In an example embodiment of the functional unit 305 where the pass transistor P12 pass the driving current IFS, the current compensation unit 105 may detect the change of the driving current IFS resulting in a change of the control current ICNT and may generate the second compensation control current ICG based on the change of the control current ICNT. The amounts of the currents ICNT and IFS of the current mirror structure including transistors P11 and P12 may be determined and/or controlled based on the control signal CS. Accordingly, the current compensation unit 105 may compensate the change of the power supply current IBUS and/or IGND by controlling the compensation control current ICS and/or ICG based on the control signal CS1. For example, the compensation unit 105 may vary the value of the compensation control current ICS and/or ICG based on the value of the control signal CS1.

The functional unit 305 may further include a voltage controller 345. The voltage controller 345 may generate the control signal CS1 that is used to stabilize the current IFST flowing through the pass transistor P12 and/or that is used to control the amount of the control current ICNT. For example, as illustrated in FIG. 4A, the voltage controller 345 may control voltage level of the control signal CS1 to be proportional to the amount of the current IFST of the pass transistor P12. The voltage controller 345 may include a plurality of resistors that divide a voltage level of an output terminal (i.e., drain) of the pass transistor P12 to adjust the voltage level of the control signal CS1. The current IFST of the pass transistor P12 may be delivered to the plurality of resistors, and thus the control signal CS1 may be controlled based on the amount of the current IFST of the pass transistor P12.

As described with reference to FIG. 3A, an input terminal (or source) of the control transistor P11 may be connected to the first power supply line VBUS and an input terminal of the variable current supply unit 115 may be connected to the first power supply line VBUS. Thus, the current compensation unit 105 may compensate the power supply current IBUS and/or IGND by further transferring the first compensation control current ICS through the first power supply line VBUS, where the amount of the first compensation control current ICS is determined based on the amount of the control current ICNT.

The variable current supply unit 115 may include a current supplying circuit that is configured to transfer the compensation current ICCS from the first power supply line VBUS to the second power supply line VGND based on the control current ICNT. For example, the variable current supply unit 115 may include at least one pair of transistors. The pair of the transistors may have a current mirror structure being configure to generate the compensation current ICCS based on a reference current and the control current ICNT. That is, as will be described with reference to FIG. 5A, the current mirror structure may control the amount of the mirrored current flowing through the one transistor of the pair of the transistors where the mirrored current is proportional to the base current flowing through the other transistor of the pair of the transistors. The amount of the base current may be determined based on the control current ICNT and thus the amount of the control current ICNT may be determined based on control signal CS1 generated based on the driving current IFS. Hence, the amount of the mirrored current may relate to the amount of the driving current IFS of the functional unit 300 in FIG. 1. Accordingly, the variable current supply unit 115 may control the amount of the compensation current ICCS based on the control current ICNT of which the amount is controlled based on the control signal CS1 indicating the amount of the current IFST of the pass transistor P12. The current IFST may be identical to or a portion of the driving current IFS. For example, when the reference current of the current mirror structure is substantially the same as a sum of the amounts of the mirrored current and the base current, the amount of the base current may be smaller than the amount of the reference current by the amount of the control current ICNT. In this case, the variable current supply unit 115 may generate the compensation current ICCS of which the amount is proportional to the amount of the base current.

Referring to FIG. 4B, an electronic device 16 may include a functional unit 306 and a current compensation unit 106. The functional unit 306 may include a pass transistor N12. The pass transistor N12 may pass the current IFST flowing to the second power supply line VGND. The functional unit 306 may control the amount of the current IFST based on the control signal CS2. The current compensation unit 106 may include a control transistor N11 connected to the pass transistor N12 to form a current mirror structure having a mirror ratio M. The control transistor N11 may pass the control current ICNT that is proportional to the current IFST of the pass transistor N12. The mirror ratio M corresponds to a ratio of the current IFST to the control current ICNT. For example, the control current ICNT may be M times smaller than the current IFST. Thus, the current compensation unit 106 may pass the first compensation control current ICS in response to the current IFST of the pass transistor N12. Accordingly, the current compensation unit 106 may compensate the changes of the power supply current IBUS and/or IGND based on the control current ICNT. The transistors N11 and N12 may be N-type transistors and thus the functional unit 306 may include a voltage regulator using an N-type transistor as the pass transistor N12.

The current compensation unit 106 may detect changes of the driving current IFS and/or IFG because the control transistor N11 pass the control current ICNT of which the amount is proportional to the current IFST flowing thorough the pass transistor N12, where the pass transistor N12 and the control transistor N11 form the current mirror structure having the current mirror ratio M. In an example embodiment of the functional unit 306 where the pass transistor N12 pass the driving current IFS, the current compensation unit 106 may detect the change of the driving current IFS resulting in a change of the control current ICNT and may generate the first compensation control current ICS based on the change of the control current ICNT. The amounts of the currents ICNT and IFS of the current mirror structure including transistors P11 and P12 may be determined or controlled based on the control signal CS2. Accordingly, the current compensation unit 105 may compensate the change of the power supply current IBUS or IGND by controlling the compensation control current ICS or ICG based on the control signal CS2.

The functional unit 306 may further include a voltage controller 346. The voltage controller 346 may generate the control signal CS2 that is used to stabilize the current IFST flowing through the pass transistor N12 or used to control the amount of the control current ICNT.

As described with reference to FIG. 3B, an input terminal (or source) of the control transistor N11 may be connected to the second power supply line VGND and an input terminal of the variable current supply unit 116 may be connected to the second power supply line VGND. Thus, the current compensation unit 106 may compensate the power supply current IBUS and/or IGND by further transferring the second compensation control current ICG through the second power supply line VGND, where the amount of the second compensation control current ICG is determined based on the amount of the control current ICNT.

The variable current supply unit 116 may include a current supplying circuit that is configured to transfer the compensation current ICCG from the first power supply line VBUS to the second power supply line VGND based on the control current ICNT. For example, the variable current supply unit 116 may include at least one pair of transistors. The pair of the transistors may have a current mirror structure being configure to generate the compensation current ICCG based on the reference current and the control current ICNT. That is, as will described with reference to FIG. 5B, the current mirror structure may control the amount of the mirrored current flowing through the one transistor of the pair of the transistors where the mirrored current is proportional to the base current flowing through the other transistor of the pair of the transistors. Accordingly, the variable current supply unit 116 may control the amount of the compensation current ICCG based on the control current ICNT of which the amount is controlled based on the control signal CS2 indicating the amount of the current IFST of the pass transistor N12. The current IFST may be identical to or may be a portion of the driving current IFS. For example, when the reference current of the current mirror structure is substantially the same as a sum of the amounts of the mirrored current and the base current, the amount of the base current may be smaller than the amount of the reference current by the amount of the control current ICNT. In this case, the variable current supply unit 116 may generate the compensation current ICCG of which the amount is proportional to the amount of the base current.

The electronic device 16 of FIG. 4B is similar to the electronic device 15 of FIG. 4A, except that the current compensation unit 106 and the functional unit 306 include N-type transistors and thus have different circuit configurations according to the type of the transistors N11 and N12.

FIG. 5A is a circuit diagram illustrating an example of the current compensation unit in the electronic device of FIG. 4A.

Referring to FIG. 5A, a current compensation unit 107 may include a current control unit 137 and a variable current supply unit 117.

The variable current supply unit 117 may include a first transistor P21 and a second transistor P22. The first and second transistors P21 and P22 may be P-type transistors, for example, P-type metal oxide semiconductors (PMOS).

The first transistor P21 may generate a first compensation current ICCS1 based on the control current ICNT such that the first compensation current ICCS1 increases when the control current ICNT decreases and the first compensation current ICCS1 decreases when the control current ICNT increases. The second transistor P22 is coupled to the first transistor P21 to form a current mirror structure having a mirror ratio M. The second transistor P22 may generate a second compensation current ICCS2 that is proportional to the first compensation current ICCS1. An amount of the second compensation current ICCS2 may be M times larger than the amount of the first compensation current ICCS1, where M is a mirror ratio of the current mirror structure. The amount of the compensation current ICCS, which flows from the first power supply line VBUS to the variable current supply unit 117, may be substantially the same as a sum of the amounts of the first compensation current ICCS1 and the second compensation current ICCS2. The variable current supply unit 117 may output the second compensation control current ICG to the second power supply line VGND.

A control terminal (i.e., gate) of the first transistor P21 is connected to a control terminal of the second transistor P22 and an output terminal (i.e., drain) of the first transistor P21 is connected to an output terminal of the second transistor P22 to form the current mirror structure. The first power supply line VBUS may be connected to input terminals (i.e., source) of the transistors P21 and P22. Thus, the gate-source voltages of the transistors P21 and P22 may be substantially the same. The variable current supply unit 117 may output the second compensation current ICG to the second power supply line VGND.

Hereinafter, operations the variable current supply unit 117 having the current mirror structure are described with reference to FIG. 5A. The transistors P21 and P22 may be P-type transistors and to operate in an active mode. The amounts of the compensation currents ICCS1 and ICCS2 may relate to width-to-length ratios (W/L) of the respective transistors P21 and P22. As described above, since the gate-source voltages of the transistors P21 and P22 are substantially the same, the amounts of the compensation currents ICCS1 and ICCS2 may be proportional to each other, regardless of drain-source voltages of the transistors P21 and P22. When the width-to-length ratios (W/L) of the transistors P21 and P22 are substantially the same, the amounts of the compensation currents ICCS1 and ICCS2 may be substantially the same. In contrast, when the width-to-length ratios (W/L) of the transistors P21 and P22 are different to each other, the amount of the first compensation current ICCS1 may be proportional to the amount of the second compensation current ICC2. The mirror ratio M may be defined as a ratio of a second width-to-length ratio (W/L) of the second transistor P22 to a first width-to-length ratio (W/L) of the first transistor P21. Thus, the amount of the first compensation current ICCS1 may be M times smaller than the amount of the second compensation current ICCS2. In some example embodiment, the mirror ratio M is larger than 1 to reduce the amount of the first compensation current ICCS1.

The variable current supply unit 117 may further include a current source generating a reference current IREF that is substantially constant. The current source may be commonly coupled to the first transistor P21 and the current control unit 137 to pass the reference current IREF to the second power supply line VGND. Thus the amount of the first compensation current ICCS1 is controlled based on the amounts of the currents IREF and ICNT. As illustrated in FIG. 5A, the sum of the first compensation current ICCS1 and the control current ICNT may be uniformly maintained since the first transistor P21 and the current control unit 137 are biased by the constant reference current IREF. Accordingly, the current control unit 137 may control the amount of the first compensation current ICCS1 based on the amount of the control current ICNT. For example, when the control current ICNT decreases, the first compensation current ICCS1 may increase. On the contrary, when the control current ICNT increases, the first compensation current ICCS1 may decrease. The variable current supply unit 117 may further include a resistor R11 between the second transistor P22 and the second power supply line VGND.

Referring again to FIG. 5A, the current control unit 137 may include a control transistor P23. The control transistor P23 may be a P-type transistor, for example, a PMOS. The control transistor P23 may receive the control signal CS1 through a control terminal (i.e., gate). As described above, the control signal CS1 may be generated based on changes of the driving current IFST of the functional unit 300. Thus the control transistor P23 may control the amount of the control current ICNT based on the driving current IFST.

Referring again to FIGS. 4A and 5A, the control transistor P23 may be connected to the pass transistor P12 to form a current mirror structure. The input terminals (i.e., source) of the transistors P12 and P23 may be connected to the first power supply line VBUS. Thus, the transistors P12 and P23 may have substantially the same gate-source voltage. The control transistor P23 may pass the control current ICNT of which the amount is proportional to the amount of the current IFST of the pass transistor P12. The output terminal of the control transistor P23 may be connected to the output terminal of the first transistor P21. Accordingly, when the sum of the first compensation current ICCS1 and the control current ICNT are maintained substantially constant by the constant reference current IREF, the variable current supply unit 117 may control the amount of the first compensation current ICCS1 based on the amount of the control current ICNT.

In an example embodiment, the electronic device 10 may include two current mirrors, a first current mirror P21 and P22 in the variable current supply unit 117 as illustrated in FIG. 5A and a second current mirror P23 and P12 as illustrated in FIG. 4A. As described above, the first current mirror include the first transistor P21 and the second transistor P22 of which the respective width-to-length ratios are defined so that the first current mirror has a first mirror ratio M1. Thus, the first current mirror may adjust the amount of the second compensation current ICCS2 to be M1 times larger than the amount of the first compensation current ICCS1. The second current mirror include the control transistor P23 and the pass transistor P12 of which the respective width-to-length ratios are defined so that the second current mirror has a second mirror ratio M2. Thus, the second current mirror may adjust the amount of the control current ICNT to be M2 times smaller than the amount of the driving current IFST of the pass transistor P12. According to example embodiments, the mirror ratio M2 may be larger than 1 so that the amount of the control current ICNT is reduced. Moreover, the mirror ratios M1 and M2 may be substantially the same.

As described above, the electronic device including the current compensation unit 107 of FIG. 5A may include the functional unit 305 of FIG. 4A, including the pass transistor P12 connected to the control transistor P23 to form the second current mirror.

FIG. 5B is a circuit diagram illustrating an example of the current compensation unit in the electronic device of FIG. 4B.

Referring to FIG. 5B, a current compensation unit 108 may include a current control unit 138 and a variable current supply unit 118.

The variable current supply unit 118 may include a first transistor N21 and a second transistor N22. The first and second transistors N21 and N22 may be N-type transistors, for example, N-type metal oxide semiconductors (NMOS).

The first transistor N21 may generate a first compensation current ICCG1 based on the control current ICNT such that the first compensation current ICCS1 increases when the control current ICNT decreases and the first compensation current ICCS1 decreases when the control current ICNT increases. The second transistor N22 is coupled to the first transistor N21 to form a current mirror structure having a mirror ratio M. The second transistor N22 may generate a second compensation current ICCG2 that is proportional to the first compensation current ICCS1. An amount of the second compensation current ICCG2 may be M times larger than the amount of the first compensation current ICCG1, where M is a mirror ratio of the current mirror structure. The amount of the compensation current ICCG, which flows from the variable current supply unit 118 to the second power supply line VGND, may be substantially the same as a sum of the amounts of the first compensation current ICCG1 and the second compensation current ICCG2. The variable current supply unit 118 may receive the first compensation control current ICS from the first power supply line VBUS.

A control terminal (i.e., gate) of the first transistor N21 is connected to a control terminal of the second transistor N22 and an output terminal (i.e., drain) of the first transistor N21 is connected to an output terminal of the second transistor N22 to form the current mirror structure. The second power supply line VGND may be connected to input terminals (i.e., source) of the transistors N21 and N22. Thus, the gate-source voltages of the transistors N21 and N22 may be substantially the same. The variable current supply unit 118 may receive the first compensation current ICS from the first power supply line VBUS.

Hereinafter, operations the variable current supply unit 118 having the current mirror structure are described with reference to FIG. 5B. The transistors N21 and N22 may be N-type transistors and may operate in an active mode. The amounts of the compensation currents ICCG1 and ICCG2 may relate to width-to-length ratios (W/L) of the respective transistors N21 and N22. As described above, since the gate-source voltages of the transistors N21 and N22 are substantially the same, the amounts of the compensation currents ICCG1 and ICCG2 may be proportional to each other, regardless of drain-source voltages of the transistors N21 and N22. When the width-to-length ratios (W/L) of the transistors N21 and N22 are substantially the same, the amounts of the compensation currents ICCG1 and ICCG2 may be substantially the same. In contrast, when the width-to-length ratios (W/L) of the transistors N21 and N22 are different to each other, the amount of the first compensation current ICCG1 may be proportional to the amount of the second compensation current ICCG2. The mirror ratio M may be defined as a ratio of a second width-to-length ratio (W/L) of the second transistor N22 to a first width-to-length ratio (W/L) of the first transistors N21. Thus, the amount of the first compensation current ICCG1 may be M times smaller than the amount of the second compensation current ICCG2. In some example embodiment, the mirror ratio M is larger than 1 to reduce the amount of the first compensation current ICCG1.

The variable current supply unit 118 may further include a current source generating a reference current IREF that is substantially constant. The current source may be commonly coupled to the first transistor N21 and the current control unit 138 to pass the reference current IREF from the first power supply line VBUS. Thus, the amount of the first compensation current ICCG1 is controlled based on the amounts of the currents IREF and ICNT. As illustrated in FIG. 5B, the sum of the first compensation current ICCG1 and the control current ICNT may be uniformly maintained since the first transistor N21 and the current control unit 138 are biased by the constant reference current IREF. Accordingly, the current control unit 138 may control the amount of the first compensation current ICCG1 based on the amount of the control current ICNT. For example, when the control current ICNT decreases, the first compensation current ICCG1 may increase. On the contrary, when the control current ICNT increases, the first compensation current ICCG1 may decrease. The variable current supply unit 118 may further include a resistor R12 between the second transistor N22 and the first power supply line VBUS.

Referring again to FIG. 5B, the current control unit 138 may include a control transistor N23. The control transistor N23 may be an N-type transistor, for example, an NMOS. The control transistor N23 may receive the control signal CS2 through a control terminal (i.e., gate). As described above, the control signal CS2 may be generated based on changes of the driving current IFST of the functional unit 300. Thus the control transistor N23 may control the amount of the control current ICNT based on the driving current IFST.

Referring again to FIGS. 4B and 5B, the control transistor N23 may be connected to the pass transistor N12 to form a current mirror structure. The input terminals (i.e., source) of the transistors N12 and N23 may be connected to the second power supply line VGND. Thus, the transistors N12 and N23 may have substantially the same gate-source voltage. The control transistor N23 may pass the control current ICNT of which the amount is proportional to the amount of the current IFST of the pass transistor N12. The output terminal of the control transistor N23 may be connected to the output terminal of the first transistor N21. Accordingly, when the sum of the first compensation current ICCG1 and the control current ICNT are maintained substantially constant by the constant reference IREF, the variable current supply unit 118 may control the amount of the first compensation current ICCG1 based on the amount of the control current ICNT.

As described above, the electronic device may include two current mirrors, a first current mirror N21 and N22 in the variable current supply unit 118 as illustrated in FIG. 5B and a second current mirror N23 and N12 as illustrated in FIG. 4B. In an example embodiment, the electronic device including the current compensation unit 108 of FIG. 5B may include the functional unit 306 of FIG. 4B including the pass transistor N12 connected to the control transistor N23 to form the second current mirror.

The current compensation unit 108 of FIG. 5B is similar to the current compensation unit 107 of FIG. 5A, except that the transistors N21, N22 and N23 are N-type transistors. Accordingly, the current compensation unit 108 has a corresponding circuit configuration using N-type transistors, and thus repeated descriptions will be omitted.

Figure 6:
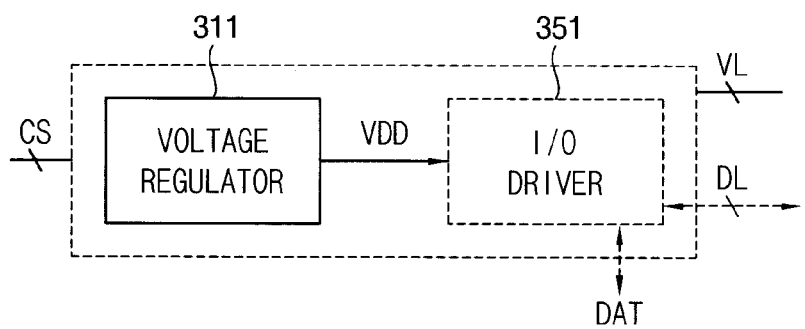
FIG. 6 is a block diagram illustrating an example of the functional unit in the electronic device of FIG. 1.

FIG. 6 is a block diagram illustrating an example of the functional unit in the electronic device of FIG. 1.

Referring to FIG. 6, the functional unit 300a may include a voltage regulator 311. The voltage regulator 311 may generate a driving voltage VDD based on the power supply voltage applied through the power supply lines VL.

In general, voltage regulators may be categorized in to a linear regulator and a switching regulator. The linear regulator has a simple circuit configuration and low noises, but has relatively low efficiency and high heat emission. On the contrary, the switching regulator has relatively high efficiency and low heat emission. However, the switching regulator has relatively high noises and a complicated circuit configuration compared to the linear regulator.

The linear regulator may include, but is not limited to, a GP regulator, a low-dropout (LDO) regulator, a quasi regulator, a shunt regulator, etc. Among various types of the linear regulators, the LDO regulator requires lower power supply voltages than other types of linear regulators, to output the same driving voltage based on the power supply voltages. That is, the LDO regulator has a relatively low-dropout. Moreover, the LDO regulator has relatively high performance on stabilization of the driving voltage and has relatively low heat emission.

The voltage regulator 311 may include one of the various voltage regulators described above. For convenience of description, the voltage regulator 311 may include, but is not limited to, a LDO regulator including a P-type pass transistor of low output saturation.

The functional unit 300a may further include an input/output (I/O) driver 351. The I/O driver 351 may receive the driving voltage VDD and may drive at least one data line DL to transmit the data DAT to a host through the data line DL. The I/O driver 351 may receive data DAT from other devices, such as a data processing device and a memory device, to transmit the received data DAT through the data line DL. Moreover, the I/O driver 351 may receive the DAT from the data line DL to transmit the received data DAT to the devices such as the data processing device and the memory device. In an example embodiment, the I/O driver 351 may drive the data line DL to perform data communication in accordance with universal serial bus (USB) protocol. That is, the functional unit 300a including the I/O driver 351 may perform data communication in accordance with USB protocol. The current compensation unit 100 of FIG. 1 may output the compensation control current ICCS (or ICCG) while the functional unit 300a drives the data line DL so that the power supply current IBUS (or IGND) flowing through the power supply lines VBUS (or VGND) is maintained substantially constant or uniformly maintained within a relatively small range.

The I/O driver 351 may transmit and/or receive the data DAT in accordance with at least one of various data interface protocols. Thus specification and configuration of the voltage regulator 311 may be determined in accordance with the data interface protocol of the I/O driver 351. The electronic device 10 may be various types of memory devices such as a secure digital (SD) card, a compact flash (CF) card, an xD picture card, a memory stick, a micro drive, a smart media (SM) card, a multi media card (MMC), an embedded MMC, a micro SD card, a MiniSD card, an SD high capacity (SDHC) card, an USB device, and the like. In this case, specification and configuration of the voltage regulator 311 may be determined according to the type of the electronic device 10. The data interface protocol may include a standard of power supply as well as a standard of data communication.

In some example embodiments, at least one of the data line DL and the power supply lines VL may be connected to the host through at least one inductive cable, as will be described with reference to FIG. 13.

Figure 7:
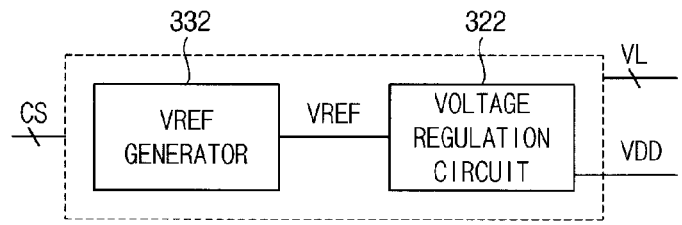
FIG. 7 is a block diagram illustrating an example of the voltage regulator in the functional unit of FIG. 6.

FIG. 7 is a block diagram illustrating an example of the voltage regulator in the functional unit of FIG. 6.

Referring to FIG. 7, the voltage regulator 312 may include a reference voltage generator 332 and a voltage regulation circuit 322. The voltage regulation circuit 322 may generate the driving voltage VDD based on the reference voltage VREF applied from the reference voltage generator 332. The voltage regulation circuit 322 may generate the control signal CS based on the amount of an internal current of the voltage regulation circuit 322.

According to some example embodiments, the reference voltage generator 332 may include a diode (e.g., a zener diode) connected between the second power supply line VGND and the voltage regulation circuit 322.

Figure 8:
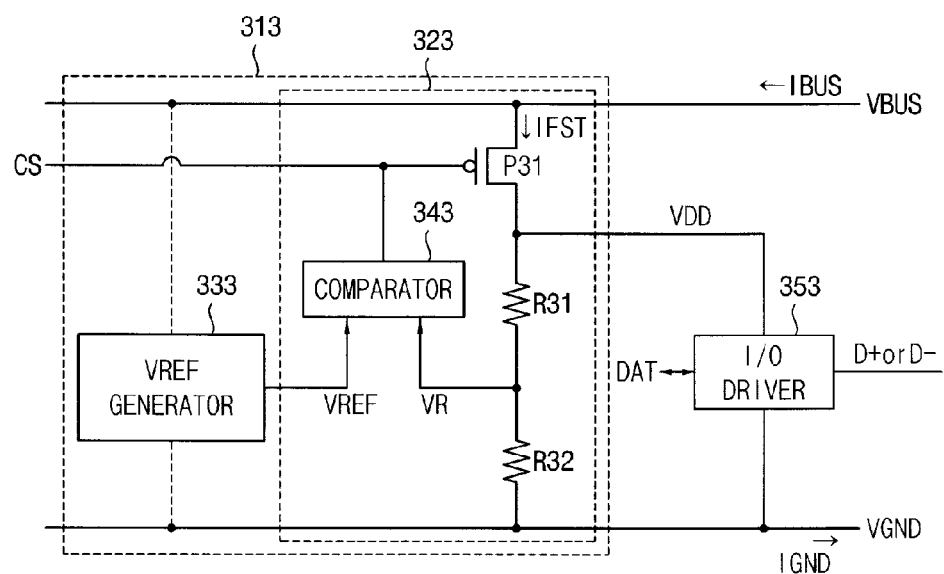
FIG. 8 is a diagram illustrating another example of the functional unit in the electronic device of FIG. 1.

FIG. 8 is a diagram illustrating another example of the functional unit in the electronic device of FIG. 1. For convenience of illustration, the functional unit corresponding to one data line D+ or D− of the data line DL is illustrated in FIG. 8.

Referring to FIG. 8, the functional unit 300b may include the voltage regulator 313 and the I/O driver 353. The voltage regulator 313 may include the reference voltage generator 333 and the voltage regulation circuit 323. The voltage regulator 313 may be a LDO regulator.

The voltage regulation circuit 323 may include a pass transistor P31 and a comparator 343. The transistor P31 may control the driving current IFST based on the control signal CS received through a control terminal (i.e., gate). The comparator 343 may generate the control signal CS by comparing voltage levels of a target voltage VR and the reference voltage. The target voltage VR may have time-varying voltage level according to changes in the amount of the current IFST of the transistor P31. The voltage regulation circuit 323 may further include resistors R31 and R32 connected in series between the transistor P31 and the second power supply line VGND. The voltage regulation circuit 323 may output the driving voltage VDD to the I/O driver 353 through the output terminal (i.e., drain) of the transistor P31.

The transistor P31 included in the voltage regulation circuit 323 may be a P-type transistor, for example, a PMOS. According to some example embodiments, the voltage regulation circuit 322 of FIG. 7 may be implemented using an N-type transistor instead of the P-type transistor to generate the driving voltage VDD.

In the example embodiment where the voltage regulation circuit 322 of FIG. 7 is implemented using the P-type transistor P31, the electronic device 10 may include the current compensation unit 107 implemented using P-type transistors as illustrated in FIG. 5A. In another example embodiment where the voltage regulation circuit 322 of FIG. 7 is implemented using a N-type transistor, the electronic device 10 may include the current compensation unit 108 implemented using N-type transistors as illustrated in FIG. 5B.

In other example embodiments, the voltage regulator 313, such as a LDO regulator, may further include a first capacitor and a second capacitor. The first capacitor may be connected between the power supply lines VBUS and VGND. The second capacitor may be connected between an output terminal of the transistor P31 and the second power supply line VGND (or a ground line). The capacitors may reduce the instability of the voltage regulator 313 and may protect the voltage regulator 313 from damages due to sudden changes of input/output currents.

The I/O driver 353 may receive the data DAT to transmit the received data DAT though the data line D+ or D−. The I/O driver 353 may receive the data DAT through the data line D+ or D−. For example, The I/O driver 353 may drive the data line D+ or D− to perform data communication operation on the data DAT in accordance with universal serial bus (USB) protocol. The I/O driver 353, the voltage regulation circuit 323 and the reference voltage generator 333 of FIG. 8 are similar to the I/O driver 351 of FIG. 6, voltage regulation circuit 322 and the reference voltage generator 332 of FIG. 7, respectively. Thus repeated descriptions will be omitted.

FIG. 9 illustrates waveforms of currents flowing through power supply lines connected to the electronic device of FIG. 1. In FIG. 9, waveforms of a conventional first power supply current IBPRV, a conventional second power supply current IGPRV, the first power supply current IBUS and the second power supply current IGND are illustrated. The horizontal axis represents time of which a unit time dT is about 100 ns. For convenience of description, the waveforms of the conventional power supply currents IBPRV, IGPRV and the power supply currents IBUS, IGND according to the example embodiments are illustrated with respect to the same horizontal axis.

As shown in FIG. 9, the functional unit 300 of the electronic device 10 according to the example embodiments or a conventional functional unit of a conventional electronic device starts functional operations thereof at a time point T1. Before the time point T1, the conventional functional unit or the functional unit 300 do not perform the functional operations related to the data DAT. The conventional functional unit and the functional unit 300 start functional operations related to the data DAT at the time point T1. Thus, amounts of the conventional power supply currents IBPRV, IGPRV and the power supply currents IBUS, IGND fluctuates within range.

As for the conventional electronic device, which receives power supply voltages and drive at least one data line, the conventional first power supply current IBPRV has relatively large fluctuation (i.e., dIB). However, the first power supply current IBUS of an electronic device 10 provided by at least one exemplary embodiment of the present general inventive concept may have relatively small fluctuation in current, as shown in FIG. 9. Similarly, the conventional second power supply current IGPRV has relatively large fluctuation (dIG). However, the second power supply current IGND of the electronic device 10 according to at least one exemplary embodiment of the present general inventive concept may have relatively small fluctuations as shown in FIG. 9. Accordingly, the electronic device 10 including the current compensation unit 100 according to the example embodiments may compensate changes of power supply currents IBPRV and IGPRV and thus reduce the fluctuation of current, unlike conventional power supply currents IBPRV and IGPRV.

Figure 10:
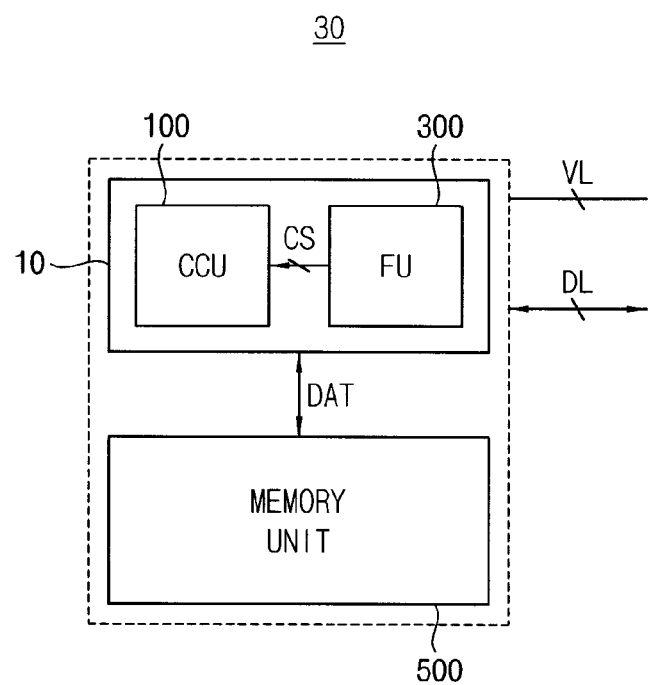
FIG. 10 is a diagram illustrating a memory device according to an example embodiment.

FIG. 10 is a diagram illustrating a memory device according to an example embodiment.

Referring to FIG. 10, a memory device 30 includes a memory unit 500 and the electronic device 10. The electronic device 10 includes the functional unit 300 and the current compensation unit 100. The memory unit 500 stores data DAT. The memory unit 500 may transmit the data DAT to the functional unit 300 based on external and/or internal command signals and receive the data DAT from the functional unit 300 to store in a memory core. The memory core may have various types, such as DRAM (including DDR and SDRAM), NAND flash and NOR flash, RRAM, PRAM, MRAM, or other memory types of memory cores.

The functional unit 300 transmits the data DAT through at least one data line DL while consuming a power supplied through the power supply lines VL that connects the memory device 30 to the host. The functional unit 300 generates the control signal CS based on the amount of power consumption of the functional unit 300. The current compensation unit 100 compensates changes in power supply current IBUS or IGND based on the control signal CS while the functional unit 300 transmits the data DAT to the host.

In an example embodiment, the memory device 30 may perform data communication in accordance with USB protocol to transmit the data DAT to the host. For example, the driving voltage VDD, which the functional unit 300 generates based on the power supply voltages. The power supply voltages may be a value of about 3.3V in accordance with the USB protocol. However, the power supply voltage is not limited thereto.

The memory device 30 may be a memory card and/or a solid state drive/disk (SSD). The memory device 30 may be may be a portable non-volatile memory including, but not limited to, a secure digital (SD) card, a compact flash (CF) card, an xD picture card, a memory stick, a micro drive, a smart media (SM) card, a multi media card (MMC), an embedded MMC, a micro SD card, a MiniSD card, an SD high capacity (SDHC) card, an USB device, and the like. Moreover, the memory unit 500 and the functional unit 300 may be configured to communicate with the host in accordance with interface protocols such as Universal Serial Bus (USB), Multimedia Card (MMC) interface, Advance Technology Attachment (ATA), Serial-ATA, Parallel-ATA, Small Computer System Interface (SCSI), Enhanced Small Disk Interface (ESDI), Integrated Drive Electronics (IDE), Peripheral Component Interconnect Express (PCI-E), Serial Attached SCSI (SAS) and the like.

The current compensation unit 100 and the functional unit 300 of FIG. 10 are similar to the current compensation unit 100 and the functional unit 300 of FIG. 1, respectively, and thus repeated descriptions will be omitted.

In general, the amount of the power supply current may be time-varying according to the data transmitted through the data line while a conventional memory device performs the data communication operations. The variance or fluctuation of the power supply current may possibly result in fluctuation of the power supply voltages applied to the conventional memory device through the power supply lines because inductance of cable that provides physical paths to transfer the power supply voltages induces fluctuation voltages due to the change of the power supply current. During the data communication operation of the conventional memory device, the induced voltages may have different voltage levels according to each of the data being transmitted. Due to the relationship between each level of the induced voltages and each of the transmitted data, the transmitted data may be possibly recovered by detecting the induced voltages on the power supply lines VL. Thus, the conventional memory device is relatively weak in data security during data transmission or is relatively vulnerable in data security.

Accordingly, the memory device 30 may adjust the power supply current within a relatively small range so that the amount of the power supply current is substantially uniform regardless of operation modes performed by the functional unit 300. Thus, the memory device 30 may reduce the security vulnerability of a system including the memory device 30 or may reduce noises generated due to fluctuations in the power supply lines VL.

Figure 11:
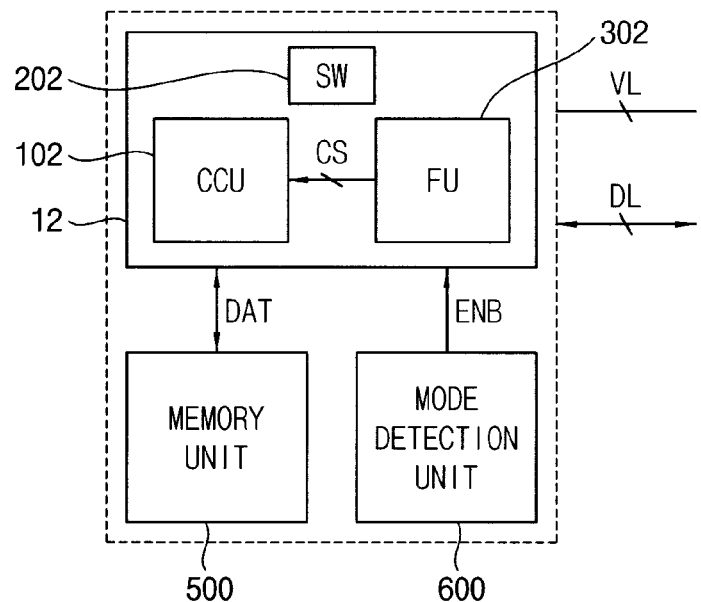
FIG. 11 is a diagram illustrating a memory device according to another example embodiment.

FIG. 11 is a diagram illustrating a memory device according to another example embodiment.

Referring to FIG. 11, a memory device 31 includes a memory unit 500, a functional unit 302, a current compensation unit 102, the switch unit 202 and a mode detection unit 600.

The switch unit 202 may electrically disconnect the current compensation unit 102 from one of the power supply lines VL based on an enable signal ENB indicating operation modes of the functional unit 302, as described with reference to FIG. 2B. In an example embodiment, the switch unit 202a 202 may be connected between the second power line VGND and the current compensation unit 102. In another example embodiment, the switch unit may be connected between the first power line VBUS and the current compensation unit 102.

As described with reference to FIG. 2B, the memory device 31 may have various operation modes. For example, the data transfer mode may be considered as a security mode and the internal operation mode may be considered as a non-security mode without accompanying data communication. The mode detection unit 600 may detect the operation mode of the memory device 31 to generate the enable signal ENB. For example, the mode detection unit 600 may activate the enable signal ENB into an activation level (e.g., 1) upon detecting the data transfer mode or the security mode. On the contrary, the mode detection unit 600 may deactivate the enable signal ENB into a deactivation level (e.g., 0) upon detecting the internal operation mode or the non-security mode.

The switch unit 202 of FIG. 11 is similar to the switch unit 202 of FIG. 2B. The memory device 31 of FIG. 11 is similar to memory device 30 of FIG. 10, except that the memory device 31 further include the switch unit 202 and the mode detection unit 600 compared with the memory device 30, and thus repeated descriptions will be omitted.

Figure 12:
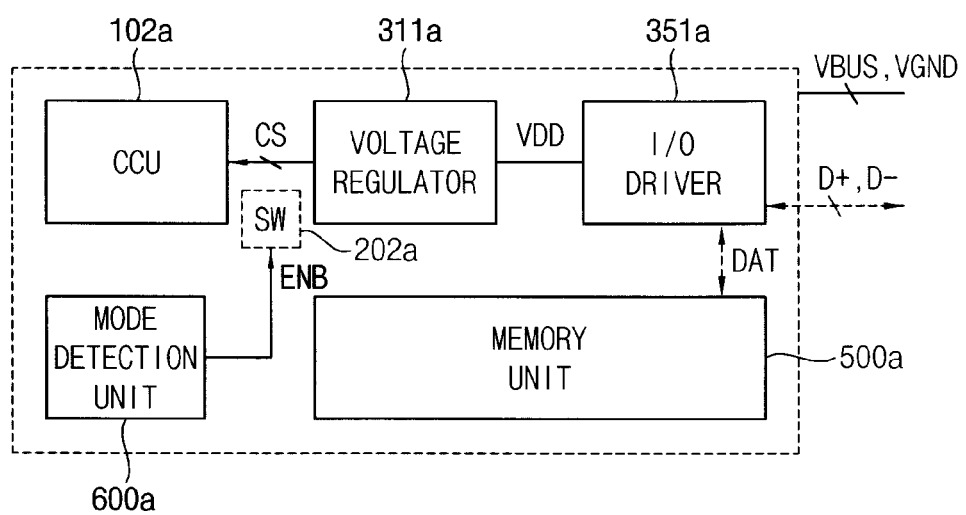
FIG. 12 is a diagram illustrating a memory device according to still another example embodiment.

FIG. 12 is a diagram illustrating a memory device according to still another example embodiment.

Referring to FIG. 12, the memory device 32 includes the voltage regulator 311a, the current compensation unit 102a, the I/O driver 351a, the switch unit 202a, the mode detection unit 600a and the memory unit 500a.

The voltage regulator 311a which may be a LDO regulator generates a driving voltage VDD based on the power supply voltages applied through the power supply lines VL. For example, the driving voltage VDD may be about 3.3V in accordance with the USB protocol, but is not limited thereto. The voltage regulator 311a generates the control signal CS based on changes of amounts of the power supply currents flowing through the power supply lines VBUS and/or VGND. In an example embodiment, voltage regulator 311a may include a pass transistor to generate the driving voltage VDD and to pass driving currents. For example, the voltage regulator 311a generates the control signal CS based on an amount of the driving current flowing through the pass transistor.

The current compensation unit 102a may compensate changes in the power supply current based on the control signal CS, where the power supply current flows through the power supply lines VL.

The I/O driver 351a may receive the data DAT to transmit the received data DAT though the data line D+ or D−. The I/O driver 351a may receive the data DAT through the data line D+ or D−. For example, The I/O driver 351a may drive the data line D+ and/or D− to perform data communication operation on the data DAT in accordance with an interface protocol such as USB protocol.

The memory unit 500a stores data DAT. The memory unit 500 500a may transmit the data DAT to the I/O driver 351a based on external or internal command signals and receive the data DAT from the I/O driver 351a to store in a memory core. The memory core may have various types, such as DRAM (including DDR and SDRAM), NAND flash and NOR flash, RRAM, PRAM, MRAM, or other memory types of memory cores.

The switch unit 202a electrically disconnects the current compensation unit 102a from one of the power supply lines VL based on an enable signal ENB indicating operation modes of the memory device 32. The mode detection unit 600a may detect the operation mode of the memory device 32 to generate the enable signal ENB. For example, the mode detection unit 600a may activate the enable signal ENB into an activation level (e.g., 1) upon detecting the security mode. On the contrary, the mode detection unit 600a may deactivate the enable signal ENB into a deactivation level (e.g., 0) upon detecting the non-security mode.

The voltage regulator 311a, the I/O driver 351a, the current compensation unit 102a, the memory unit 500a, the switch unit 202a and the mode detection unit 600a of FIG. 12 are similar to the voltage regulator 311, the I/O driver 351 of FIG. 6, the current compensation unit 102 of FIG. 2B, the memory unit 500 of FIG. 10, the switch unit 202 of FIG. 2B and the mode detection unit 600 of FIG. 11, respectively, and thus repeated descriptions will be omitted.

Accordingly, the memory device 32 may adjust the power supply current within a relatively small so that the amount of the power supply current is substantially uniform regardless of operation modes of the memory device 32. Thus, the memory device 32 may reduce the security vulnerability of a system including the memory device 32 or may reduce noises generated due to fluctuations in the power supply lines VL.

Figure 13:
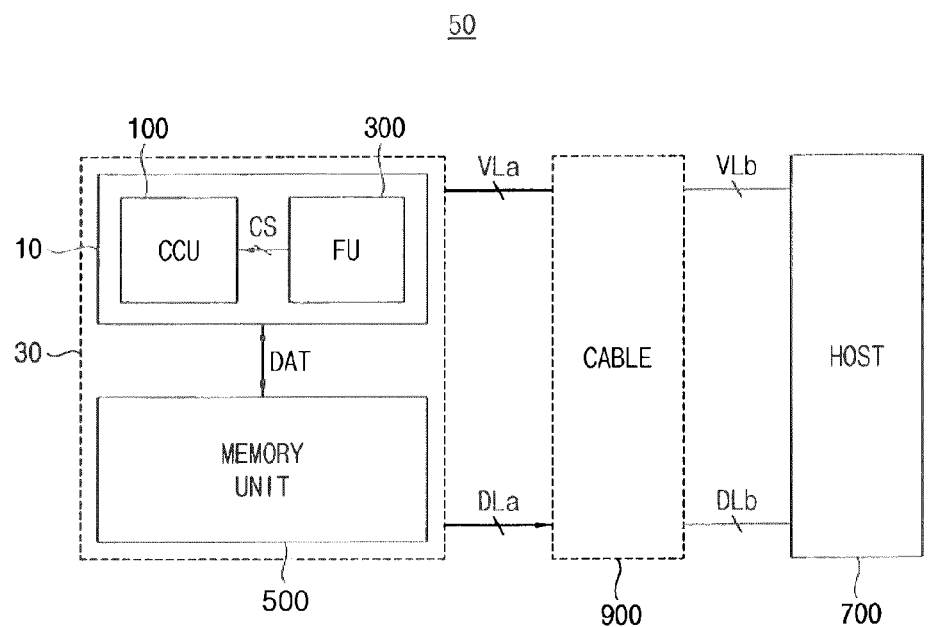
FIG. 13 is a block diagram illustrating a memory system according to some example embodiments.

FIG. 13 is a block diagram illustrating a memory system according to some example embodiments.

Referring to FIG. 13, the memory system 50 includes the memory device 30 and a host 700.

The memory device 30 may compensate changes in the power supply currents flowing through the power supply lines VLa. The memory device 30 includes a memory unit 500 and the electronic device 10. The electronic device 10 includes the functional unit 300 and the current compensation unit 100. The memory unit 500 stores data DAT. The memory unit 500 may transmit the data DAT to the functional unit 300 based on external or internal command signals and receive the data DAT from the functional unit 300 to store in a memory core. The memory core may have various types, such as DRAM (including DDR and SDRAM), NAND flash and NOR flash, RRAM, PRAM, MRAM, or other memory types of memory cores.

The functional unit 300 transmits the data DAT through at least one data line DLa while consuming a power supplied through the power supply lines VLa that connects the memory device 30 to the host 700. The functional unit 300 generates the control signal CS based on the amount of power consumption of the functional unit 300. The functional unit 300 may perform various operations based on the data DAT received from the memory unit 500 while receiving the power supply voltages through the power supply lines VLa. The current compensation unit 100 compensates changes in power supply current IBUS and/or IGND based on the control signal CS while the functional unit 300 transmits the data DAT to the host 700. The memory device 30 of FIG. 13 corresponds to the memory device 30 of FIG. 10. Thus, repeated descriptions will be omitted.

The host 700 provides the power supply voltages to the memory device 30 through the power supply lines VLb and VLa. The host 700 may perform a data communication operation to interface with the memory device 30 in accordance with various types of interface protocols, such as Universal Serial Bus (USB), Multimedia Card (MMC) interface, Advance Technology Attachment (ATA), Serial-ATA, Parallel-ATA, Small Computer System Interface (SCSI), Enhanced Small Disk Interface (ESDI), Integrated Drive Electronics (IDE), Peripheral Component Interconnect Express (PCI-E), Serial Attached SCSI (SAS) and the like. In an example embodiment, the memory unit 30 and the host 700 may perform the data communication operation to each other in accordance with the USB protocol including, but not limited to, USB standards versions 1.x, 2.x, 3.x and the like.

The host 700 transmits and receives the data DAT through the data lines DLb and DLa. The data line DLb may be connected to the memory device 30 through a cable 900. In an example embodiment, the host 700 and the memory device 30 may be connected to each other using an USB standard connector types A or B, an USB mini connector, an USB micro connector or the like. Thus, the cable 900 may be one of the above types of the USB connectors.

The conventional cable, such as the USB cable, generally has an inductance. Consequently, the inductance in the cable may lead to changes in power supply voltages uniformly applied through the power supply lines. In general, when the conventional cable has larger inductance or the power supply currents applied through the power supply lines has larger fluctuation per unit time, the changes of the power supply voltages may become larger. This larger fluctuation of the power supply voltages may result in noises during the data communication between the host and the memory device. Conventionally, capacitors may be connected to the power supply lines to reduce the noises between the host and the memory device. However, there are limitations on the above method to reduce the noises. Moreover, the noises of the power supply lines may lead to security vulnerability because data being transmitted may be possibly detected in accordance with changes of the noises.

Accordingly, the memory system 50 may adjust the power supply current within a relatively small amount so that the amount of the power supply current is substantially uniform regardless of operation modes of the memory device 30. Thus, the memory system 50 may reduce the security vulnerability of a system including the memory device 30 and may reduce noises generated due to fluctuations of the power supply lines VL.

Figure 14:
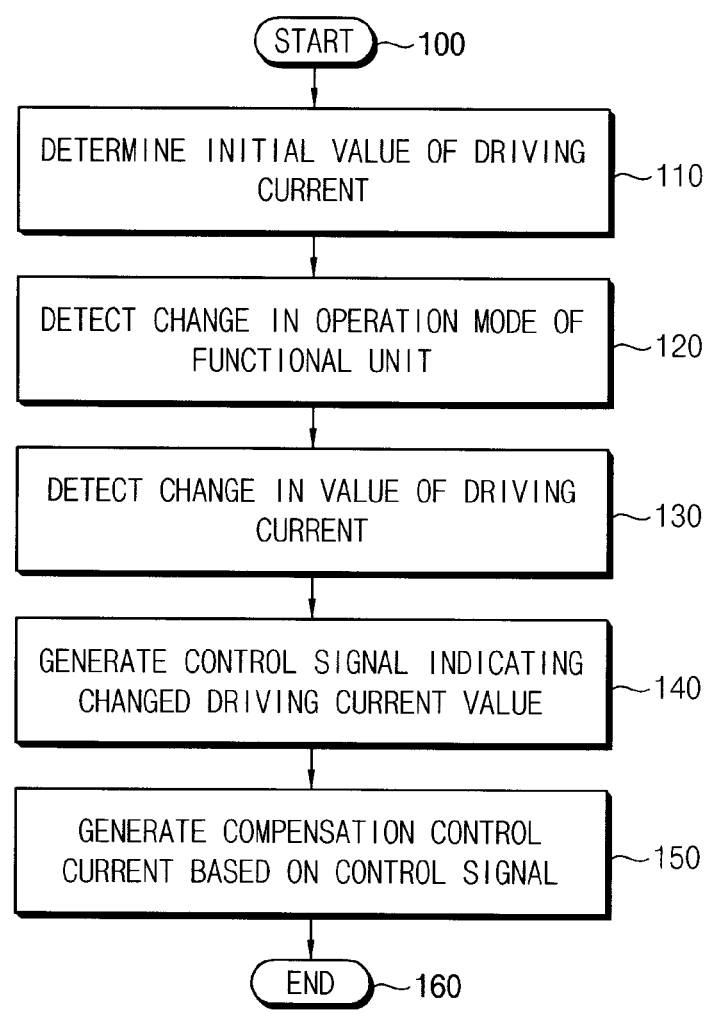
FIG. 14 is a flowchart illustrating a method of compensating current in an electronic device according to an exemplary embodiment of the present general inventive concept.

Referring to FIG. 14, a flowchart illustrates a method of compensating current in an electronic device according to an exemplary embodiment of the present general inventive concept. The method begins at operation 100, and proceeds to operation 110 to determine an initial value of a driving current driving a functional unit. As described above, the functional unit may include, but is not limited to, a dynamic random-access memory (DRAM) memory module (including a doublet data rate (DDR) memory module and a synchronous dynamic random-access memory (SDRAM) memory module), NAND flash memory module and NOR flash memory module, a resistive random-access memory (RRAM) memory module, a phase-change (PRAM) memory module, and a magnetoresistive random-access memory (MRAM) memory module. In operation 120, a change in an operation mode of the functional unit is detected. In operation 130, a change in the value of the driving current based on the changed operation mode is detected. A control signal is generated in operation 140. The control signal indicates the value i.e., amount, of the changed driving current. For example, the control signal may indicate a differential in current value and/or may indicate the actual value, i.e., amount, of the driving current in response to the changing of the operational mode of the functional unit. A compensation control current is generated in operation 150, which compensates the change of the driving circuit. For example, if the driving current decreases, the compensation control current may be increases. Alternatively, if the driving current increases, the compensation control current may be decreased. Accordingly, the driving current may be compensated such that the a power supply current delivered from a power supply is maintained, and the method ends at operation 160.

The described exemplary embodiments may be employed in different types of memory systems, such as DRAM (including DDR and SDRAM), NAND flash and NOR flash, RRAM, PRAM, MRAM, or other memory systems. In addition, features of the disclosed exemplary embodiments may be used in systems such as microprocessor systems, digital signal processors, communication system processors, or other systems that use enable or disable signals, as well as in embedded memory systems.

The foregoing is illustrative of example embodiments and is not to be construed as limiting thereof. Although a few example embodiments have been described, those skilled in the art will readily appreciate that many modifications are possible in the example embodiments without materially departing from the novel teachings and utilities of the present general inventive concept. Accordingly, all such modifications are intended to be included within the scope of the present inventive concept as defined in the claims.

Although the electronic device and the memory device have been mainly described to have current mirror configurations as illustrated in FIGS. 4A, 4B, 5A and 5B, exemplary embodiments may have different current mirror configurations within the scope of the present inventive concept. Although the electronic device and the memory device have been mainly described to have a certain number of data lines used to communicate with the external host, exemplary embodiments may have various numbers of interface lines. Although the electronic device and the memory device have been mainly described to have a certain number of current mirrors, exemplary embodiments may have various numbers of the current mirrors. Although the electronic device and the memory device have been mainly described to include a low-dropout regulator, exemplary embodiments may include other types of regulators such as a switching regulator. Although the memory device has been mainly described to have a certain number of memory cores, exemplary embodiments may have various numbers of the memory cores.

Although a few exemplary of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. An electronic device comprising:
   a functional unit configured to operate based on a power that is supplied by an external host through power supply lines, and configured to generate a control signal based on an amount of power consumption of the functional unit; and
   a current compensation unit configured to compensate a change in a power supply current based on the control signal, the power supply current flowing through the power supply lines.

2. The electronic device of claim 1, wherein the current compensation unit includes:
   a current control unit configured to generate a control current based on the control signal received from the functional unit such that the control current is proportional to a driving current provided to the functional unit; and
   a variable current supply unit configured to generate a compensation current based on the control current such that the compensation current increases when the control current decreases and the compensation current decreases when the control current increases.

3. The electronic device of claim 2, wherein the variable current supply unit includes:
   a first transistor configured to generate a first compensation current based on the control current such that the first compensation current increases when the control current decreases and the first compensation current decreases when the control current increases; and
   a second transistor coupled to the first transistor to form a current mirror structure having a mirror ratio, the second transistor being configured to generate a second compensation current that is proportional to the first compensation current.

4. The electronic device of claim 3, wherein a sum of the first compensation current and the control current corresponds to a reference current.

5. The electronic device of claim 4, wherein the variable current supply unit further includes:
   a current source commonly coupled to the first transistor and the current control unit to generate the reference current that is substantially constant.

6. The electronic device of claim 2, wherein the current control unit includes:
   a transistor configured to receive the control signal through a control terminal and configured to generate the control current based on the control signal.

7. The electronic device of claim 1, wherein the functional unit includes:
   a low-dropout regulator connected between the power supply lines, the low-dropout regulator being configured to generate a driving voltage based on a power supply voltage; and
   an I/O driver configured to operate based on the driving voltage and configured to transmit data to the external host through at least one data line.

8. The electronic device of claim 7, wherein the low-dropout regulator includes:
   a transistor configured to receive the control signal through a control terminal and configured to generate a driving current that is adjusted based on the control signal; and
   a comparator configured to compare a target voltage and a reference voltage to generate the control signal, the target voltage being proportional to the current of the transistor.

9. The electronic device of claim 1, wherein the functional unit includes a pass transistor configured to generate a driving current based on the control signal, and the current compensation unit includes a control transistor configured to generate a control current based on the control signal, the control current being proportional to the driving current.

10. The electronic device of claim 9, wherein the current compensation unit further includes at least one current mirror configured to generate a compensation current such that the compensation current increases when the control current decreases and the compensation current decreases when the control current increases.

11. The electronic device of claim 1, wherein the functional unit is configured to drive at least one data line to perform data communication in accordance with universal serial bus (USB) protocol, and
   wherein the current compensation unit is configured to generate a compensation current while the functional unit drives the at least one data line, so that the power supply current flowing through the power supply lines remains substantially constant.

12. The electronic device of claim 1, further comprising:
   a switch unit configured to electrically disconnect the current compensation unit from the power supply lines in response to an enable signal indicating operation modes of the functional unit.

13. A memory device comprising:
   a memory unit configured to store data;
   a functional unit configured to transmit the data through at least one data line based on a power supplied by an external host through the power supply lines, the functional unit configured to generate a control signal based on an amount of power consumption of the functional unit; and
   a current compensation unit configured to compensate a change in a power supply current based on the control signal while the functional unit transmits the data to the external host, the power supply current flowing through the power supply lines.

14. The memory device of claim 13, wherein the memory device performs data communication with the external host in accordance with universal serial bus (USB) protocol.

15. The memory device of claim 13, the memory device further comprising:
   a mode detection unit configured to detect operation modes of the memory device to generate an enable signal; and
   a switch unit configured to electrically disconnect the current compensation unit from the power supply lines in response to the enable signal.

16. A current compensation module to maintain a power supply current output by a power supply to a functional unit, comprising:
- a current differential detection unit that detects a change of a driving current driving the functional unit and that generates a compensation control signal based on the changed driving current; and
- a current compensation unit that receives the compensation control signal and that generates a compensation control current that compensates the changed driving current to maintain the power supply current output by the power supply.

17. The current compensation module according to claim 16, wherein the functional unit is a memory device operable in a plurality of operating modes.

18. The current compensation module according to claim 17, wherein the current differential detection unit adjusts the value of the compensation control signal based on the changed driving current.

19. The current compensation module of claim 18, wherein the current compensation unit adjusts the value of the compensation control current based on the value of the compensation control signal.

20. The current compensation module of claim 16, wherein the driving current includes at least one of a first diving current flowing to the functional unit and a second driving current flowing from the functional unit, and
- wherein the current differential detection unit detects a change of at least one of the first driving current and the second driving current.

* * * * *